United States Patent [19]

Kramer

[11] 4,348,351
[45] Sep. 7, 1982

[54] METHOD FOR PRODUCING NEUTRON DOPED SILICON HAVING CONTROLLED DOPANT VARIATION

[75] Inventor: Horst G. Kramer, Chesterfield, Mo.

[73] Assignee: Monsanto Company, St. Louis, Mo.

[21] Appl. No.: 142,310

[22] Filed: Apr. 21, 1980

[51] Int. Cl.³ ............................................. G21G 1/06
[52] U.S. Cl. ................................................... 376/183
[58] Field of Search ........................ 176/10; 148/1.5; 376/183

[56] References Cited

U.S. PATENT DOCUMENTS

| | | | |
|---|---|---|---|
| 3,733,222 | 5/1973 | Schiller | 176/10 |
| 3,769,693 | 11/1973 | Cates et al. | 176/10 |
| 3,967,982 | 7/1976 | Arndt et al. | 176/10 |
| 4,027,051 | 5/1977 | Reuschel et al. | 176/10 |
| 4,119,441 | 10/1978 | Haas et al. | 176/10 |
| 4,129,463 | 12/1978 | Cleland et al. | 148/1.5 |

OTHER PUBLICATIONS

IEEE Trans. on Electron Devices, vol. ED-23, No. 8, Aug. 1976, pp. 797-802, Janus et al.
Nucleonics, 4/64, vol. 22, No. 4, pp. 62-65, Klahr et al.
J. of the Electrochemical Soc., vol. 108, No. 2, pp. 171-176, Tanenbaum et al.

*Primary Examiner*—Harvey E. Behrend
*Attorney, Agent, or Firm*—Paul L. Passley; Henry Croskell; William H. Duffey

[57] ABSTRACT

A method for controlling dopant variation in neutron silicon is provided wherein the selection of undoped single crystal silicon for neutron transmutation doping is based upon certain criteria, for example, a maximum dopant difference which depends only on the desired uniformity of the neutron doped material and a maximum average dopant concentration which is a function of the homogeneity of both the undoped single crystal silicon and the neutron doped product. The results achievable from using the method for controlling dopant variation in the neutron doped silicon provides uniformity of the neutron doped product determinable by the correct choice of dopant difference and dopant factor, and that the doping precision for the radiated silicon does not depend on the doping factor.

6 Claims, No Drawings

METHOD FOR PRODUCING NEUTRON DOPED SILICON HAVING CONTROLLED DOPANT VARIATION

FIELD OF THE INVENTION

The present invention relates to a method for producing neutron doped silicon having controlled dopant variation. In another aspect the invention relates to a selection process for silicon to be neutron doped which will result in controlled dopant variation of the doped silicon through the correct choice of dopant difference and dopant factor. Yet another aspect of the invention relates to a method for producing neutron doped silicon having controlled dopant variation from selected undoped silicon containing p-n junctions.

BACKGROUND OF THE INVENTION

The manufacturers of semiconductor devices often demand phosphorus doped single crystal material having a very tight tolerance for resistivity with a distribution of the dopant as homogeneous as possible. The manufacturers of high-blocking thyristors are interested in such materials because it effects an optimization of the device properties. In contrast to conventional doping methods, it is possible to accomplish the desired doping conditions by means of neutron irradiation. The exact resistivity value can be obtained within an extremely narrow limit and the material is practically free from the macroscopic and microscopic variations of the electrical resistivity observed in conventionally doped semiconductor materials.

Neutron transmutation doping is the nuclear conversion of semiconductor materials atoms into dopant, i.e., silicon atoms into phosphorus dopant atoms by exposing undoped silicon crystals to a suitable flux of thermal neutrons in the core of a nuclear reactor. The nuclear reaction involved is:

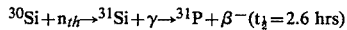

$$^{30}Si + n_{th} \rightarrow {}^{31}Si + \gamma \rightarrow {}^{31}P + \beta^- \ (t_{\frac{1}{2}} = 2.6 \text{ hrs})$$

The advantage of this technique is the chance to fabricate N-doped silicon of extreme homogeneity which is impossible to realize by conventional doping methods.

Most commercial uses of semiconductor materials require single crystal silicon of very accurately controlled resistivity. In certain instances, this requirement arises from the nature of the silicon devices, i.e., the avoidance of marked resistivity variation affecting electrical characteristics. In other words, when the device does not give rise to this requirement, characteristics of the starting material may determine the position and nature of junctions and gradients produced during manufacture, so that initially uniform properties in the starting material are necessary.

In most semiconductor materials constant resistivity is not easily obtained. The distribution coefficients for most significant impurities in, for example, silicon and the increased activity of silicon at its high melting point complicates the problem. Uniform P-type silicon has been produced by either of two methods. Using boron with a distribution coefficient of approximately 0.9, uniform crystals have been produced by crystal pulling. Using the float zone technique with aluminum, having a distribution coefficient of 0.004 P-type silicon of a high degree of uniformity has been produced by zone leveling.

The preparation of uniform resistivity N-type silicon has been a more difficult problem. The usual doping impurities of group V of the periodic chart do not lend themselves to use in conventional processing techniques. Certain of these impurities, such as antimony, are sufficiently volatile at the melting point of silicon that it is difficult to control their concentration during the usual crystal growing procedures. The less volatile group V impurities, phosphorus and arsenic, have distribution coefficients which are too small to permit uniform resistivity.

Phosphorus has been the group V element preferred for the doping of semiconductor grade silicon to give "N" type electron conductivity, especially for high resistivity materials for power devices. Since the segregation coefficient of phosphorus is relatively low, (0.35), a non-planar freezing interface during the growth of mono-crystals by the float zone process will cause a non-uniform radial distribution of phosphorus in the crystal. Since the center freezes last, it will contain more dopant than the edge. Minimizing this non-uniformity, the consequence of which is usually referred to as radial resistivity gradients, has been a goal of research in the zone-refining process. In the past few years, development of the spreading resistance probe method for measuring resistivity has revealed that numerous micro non-homogeneities exist in addition to the macro variations revealed by radial gradient measurements. It is generally agreed that the variations in dopant concentration in the crystal lattice play a major role in limiting the performance obtained in high power silicon devices and in reducing the yield in device manufacturing process.

From the view of large scale production, various aspects have to be considered like limitations due to residual radioactivity, reactor performances, irradiation capacity, requirements of the starting material, and annealing treatments. Since neutron transmutation doping can create only donors, and is hence used for applications in which the desired conductivity of the silicon is negative, most such applications specified not only the conductivity type, but also the number of donors that must be present in the silicon within narrow limits. The starting material for neutron transmutation doping, undoped single crystal silicon, will contain some donors and also some acceptors (dopant atoms that contribute an electrical hole to the conductivity, and result in positive conductivity) from the so-called base-level impurities in the polycrystalline silicon from which the single crystal silicon is produced.

One restriction in the selection of starting material for undoped single crystal silicon is that the number of donors in the material must be smaller than the number desired in the product, i.e. neutron doped silicon. Another requirement is that the number of acceptors in the undoped single crystal silicon not exceed a certain fraction of the number of donors. A third requirement is that the uniformity of the starting material be within certain limits, since any inhomogeneity in the starting material will show up as inhomogeneity in the neutron doped silicon.

Presently, the art taught methods of selecting "N" doped single crystal silicon for neutron transmutation doping specify that the starting material by ot one type only, and maximum donor or acceptor concentrations must be present at a level of only one-tenth of that desired in the neutron doped silicon product. While this rule ensures good uniformity in the product, it also results in the exclusion of up to 25% or more of all starting undoped single crystal silicon produced for neutron transmutation doping. Moreover, any material that misses the target cannot be recycled, either for the same specification or for a specification requiring additional donors; thus, the material is lost as scrap.

SUMMARY OF THE INVENTION

The present invention seeks to reclaim at least a portion of the lost starting material as well as reclaim the present art dopant "misses" for additional neutron transmutation doping. The method for producing neutron doped silicon having controlled dopant variation achieves these improvements not only by measuring the maximum dopant concentration in the starting or reject material, but also its degree of homogeneity, and then comparing this to the degree of homogeneity desired in the final neutron transmutation doped silicon product. The maximum dopant concentration in the starting or reject material, formerly set at one-tenth the value required in the neutron transmutation doped silicon product, is now no longer a fixed number, but depends on the homogeneity of the starting or undoped silicon material, and may be as large as one-half the desired value.

The general selection rules set out by this invention encompass material that contains "p-n junctions". This is material that contains donors and acceptors in almost equal amounts, so that either type of conductivity may predominate over small volumes of the crystal. Material containing p-n junction was excluded from the neutron transmutation doping processes taught by the art utilizing the old ten percent selection rules, but constitutes some of the best starting material since these junctions generally occur only if the donor and acceptor concentrations are not only approximately equal but are also present in only very small quantities.

The selection rules that each piece of starting material must pass according to this invention are presented hereinbelow in a mathematical presentation:

$$\Delta C_s \leq \Delta C_D$$
$$\overline{C}_s \leq \frac{a_D}{a_s} \overline{C}_D$$

where
$\Delta C_s$ = the maximum dopant difference in the starting material
  = $C_s \max - C_s \min$ $\Delta C_D$ = the maximum dopant difference desired in the final product
  = $C_D \max - C_D \min$ $\overline{C}_s$ = the average dopant concentration in the starting material
  = $\frac{1}{2}(C_s \max + C_s \min)$ $\overline{C}_D$ = the average dopant concentration desired in the final product
  = $\frac{1}{2}(C_D \max + C_D \min)$ $a_s$ = the homogeneity factor of the starting material
  = $\frac{\Delta C_s}{\overline{C}_s}$ $a_D$ = the homogeneity factor of the final product = $\frac{\Delta C_D}{\overline{C}_D}$ The following examples relate to the method according to the invention utilizing specific numerical values in the preceding mathematical relationships. Specifically, a commercially desired neutron doped silicon material specification is listed hereinbelow with example I illustrating the shortcomings of art taught selection while example II illustrates the method according to the invention and application of the mathematical selection process listed hereinabove.

EXAMPLES

A commercially meaningful neutron transmutation doped single crystal silicon material would require resistivity of 50 ohm-cm±15%. The resistivity limits are hence 42.5–57.5 ohm-cm. Converting resistivities to dopant concentrations according to the mathematical definition, we have;

Donor concentration (in ppb) = $\frac{96}{\text{resistivity (in ohm-cm)}}$

Acceptor concentration (in ppb) = $\frac{250}{\text{resistivity (in ohm-cm)}}$

Average concentration = $\overline{C}_D$ = 1.92 ppb (parts per billion)
Maximum concentration = $C_D \max$ = 2.26 ppb
Minimum concentration = $C_D \min$ = 1.67 ppb

EXAMPLE I

Example I utilizes the prior art taught selection method wherein resistivity limits for starting materials provide maximum dopant concentration in starting material equal to 0.1 times average concentration in final product which is equal to 0.1 times 1.92 which is equal to 0.192 ppb (parts per billion dopant impurity), Minimal resistivity for "N" type starting material would equal to 500 ohm-cm while minimal resistivity for "P" type starting material would equal 1300 ohm-cm and no starting material would be utilized with p-n junctions.

EXAMPLE II

Resistivity limits for starting material under the method according to the invention utilizes maximum dopant difference in starting material equal to $\Delta C_s$ equal to $C_D \max - C_D \min = 0.59$ ppb. Homo geneity factor as defined herein and for the purposes of this invention of the final product is $a_D$ equals $\Delta C_D/\overline{C}_D$ equals 0.59/1.92 equals 0.307 and homogeneity factor for starting material as defined for the purposes of this invention is represented by $a_s$ and equals 0.600. The homogeneity factor of starting material is based on the results of measurements on many pieces of starting material, and is the maximum inhomogeneity likely to be encountered. The maximum average dopant concentration in the starting material is equal to $\overline{C}_s$ which equals $a_D/a_s$ times $\overline{C}_D$ equal to 0.307/0.600 times 1.92 equal to 0.98 ppb "N" or "P" type. Minimal resistivity equals 98 ohm-cm "N" type or 255 ohm-cm "P" type.

The selection of material containing p-n junctions will be illustrated with two examples, the first example showing an acceptable piece, the second example having a rejectable piece. Donor concentrations will be considered positive numbers and acceptor concentrations as negative numbers.

EXAMPLE III

Max donor concentrations = 0.3 ppb
Max acceptor concentrations = 0.1 ppb
Max difference = 0.3 − (−0.1) = 0.4 ppb which is less than 0.59 ppb
Material is acceptable.

EXAMPLE IV

Max donor concentrations = 0.3 ppb
Max acceptor concentrations = −0.4 ppb
Max difference = 0.3 − (−0.4) = 0.7 ppb which is more than 0.59 ppb; thus, the material must be rejected.

I claim:

1. A method for producing neutron doped silicon having controlled dopant variation, comprising
    selection of undoped single crystal silicon bodies according to the following, measuring the criteria fluctuation in said undoped silicon base level dopant concentration as expressed by the difference between maximum and minimum dopant concentrations, determining the average base level dopant concentration of said undoped single crystal silicon bodies, determining the desired average dopant concentration in the neutron doped silicon, determining the desired maximum and minimum dopant concentrations in the neutron doped silicon, selecting those undoped single crystal silicon bodies whose measured fluctuation is no more than said average dopant concentration in the neutron doped silicon multiplied by a homogeneity factor of the neutron doped silicon as measured by the difference between said maximum and said minimum dopant concentrations divided by said average dopant concentration in the neutrol doped silicon and whose maximum dopant concentration in the undoped state is greater than one tenth of said desired maximum dopant concentration in the neutron doped silicon and whose base level dopant concentration in the undoped state is less than said neutron doped silicon desired average dopant concentration by a factor which is a ratio of (a) desired homogeneity in the neutron doped silicon as expressed by the difference between said maximum and said minimum dopant concentrations of the neutron doped silicon divided by said doped silicon average dopant concentration to (b) homogeneity of the undoped single crystal silicon, as measured by said difference between maximum and minimum dopant concentrations of the undoped silicon divided by said average dopant concentration subjecting said selected undoped single crystal silicon body to sufficient neutron radiation so as to obtain neutron doped silicon having said desired average dopant concentration and said desired maximum and minimum dopant concentrations.

2. A method according to claim 1 wherein the selection of undoped, single crystal silicon includes undoped silicon having p-n junctions.

3. A method according to claim 1 where the single crystal silicon is in ingot form.

4. A method according to claim 1 wherein the single crystal silicon is in wafer form.

5. A process according to claim 2 wherein the single crystal silicon is in ingot form.

6. A method according to claim 2 wherein the single crystal silicon is in wafer form.

* * * * *